United States Patent
North et al.

(10) Patent No.: US 10,178,808 B2
(45) Date of Patent: Jan. 8, 2019

(54) METHOD AND SYSTEM FOR AUTOMATICALLY SCALING PERFORMANCE IN AN INFORMATION HANDLING SYSTEM

(71) Applicant: DELL PRODUCTS, L.P., Round Rock, TX (US)

(72) Inventors: Travis C. North, Cedar Park, TX (US); Austin Michael Shelnutt, Leander, TX (US); Christopher M. Helberg, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 468 days.

(21) Appl. No.: 14/449,121

(22) Filed: Jul. 31, 2014

(65) Prior Publication Data
US 2016/0033974 A1    Feb. 4, 2016

(51) Int. Cl.
| | | |
|---|---|---|
| G05D 23/00 | (2006.01) | |
| H05K 7/20 | (2006.01) | |
| G06F 1/20 | (2006.01) | |
| G05B 15/02 | (2006.01) | |
| F28F 27/00 | (2006.01) | |
| G06F 1/32 | (2006.01) | |

(52) U.S. Cl.
CPC ............ *H05K 7/2079* (2013.01); *G06F 1/20* (2013.01); *F28F 27/00* (2013.01); *G05B 15/02* (2013.01); *G06F 1/324* (2013.01); *G06F 1/3206* (2013.01); *G06F 1/3296* (2013.01); *Y02D 10/126* (2018.01); *Y02D 10/172* (2018.01)

(58) Field of Classification Search
CPC ....... G06F 1/206; G06F 1/20; G01R 31/3004; H02P 23/0077; F04D 25/028; F04D 27/001; H05K 7/2079; F28F 27/00
See application file for complete search history.

(56) References Cited

U.S. PATENT DOCUMENTS

| | | | | |
|---|---|---|---|---|
| 5,926,386 A | * | 7/1999 | Ott | H02P 23/0077 318/471 |
| 2003/0011984 A1 | * | 1/2003 | Chu | G06F 1/206 361/679.48 |
| 2005/0030171 A1 | * | 2/2005 | Liu | G06F 1/206 340/500 |
| 2005/0049729 A1 | * | 3/2005 | Culbert | G06F 1/206 700/50 |
| 2007/0252544 A1 | * | 11/2007 | Chotoku | G06F 1/206 318/268 |
| 2008/0093458 A1 | * | 4/2008 | Pearce | F04D 27/001 235/462.32 |

(Continued)

*Primary Examiner* — Tuan A Vu
(74) *Attorney, Agent, or Firm* — Isidore PLLC

(57) ABSTRACT

A method and an information handling system for selecting or scaling system performance. The method of scaling performance of an information handling system includes a controller receiving component data that identifies a heat removal effectiveness of a cooling component, selecting a performance characteristics of the information handling system based on the received component data, and adjusting the operating parameters of the information system to achieve the selected performance characteristics and heat removal capability. The controller communicates with the cooling component through a serial signal bus. The cooling component includes a cooling device and storage.

19 Claims, 7 Drawing Sheets

(56) References Cited

U.S. PATENT DOCUMENTS

2008/0100328 A1\* 5/2008 Dhong ............... G01R 31/3004
　　　　　　　　　　　　　　　　　　　324/750.3
2013/0028751 A1\* 1/2013 Rai ....................... F04D 25/028
　　　　　　　　　　　　　　　　　　　417/13

\* cited by examiner

| Component ID | Fan #1 | Fan #2 | Fan #3 | Fan #4 | Fan #1 and Auxiliary fan |
|---|---|---|---|---|---|
| Heat Removal Capability | <80W | <150W | <200W | 300W | Fan #1 <80W Aux fan <7W |
| Heat Dissipation | 60W | 120W | 180W | 240W | 90W |
| Operating Parameters & Upper Limits | clk frequency, power, V, I, phase frequency | clk frequency, power, V, I, phase frequency | clk frequency, power, V, I, phase frequency | clk frequency, power, V, I, phase frequency | clk frequency, power, V, I, phase frequency |
| Overall Heat Removal Capability | <80W | <150W | <200W | 300W | <100W |
| Overall Heat Dissipation | 70W | 145W | 200W | 280W | 100W |
| Performance Characteristics & max. achievable performance | 2250-2750 MHz | 3000-3500 MHz | 3500-4100 MHz | 4100-4500 MHz | 3000-3100 MHz |
| Selected Operating Parameters | 2500 MHz | 3250 MHz | 4000 MHz | 4300 MHz | 3000 MHz |

METHOD AND SYSTEM FOR AUTOMATICALLY SCALING PERFORMANCE IN AN INFORMATION HANDLING SYSTEM

BACKGROUND

1. Technical Field

The present disclosure generally relates to performance scaling of an information handling system and in particular to the automatic performance scaling based on a heat removal capability of components within the information handling system.

2. Description of the Related Art

As the value and use of information continue to increase, individuals and businesses seek additional ways to process and store information. One option available to users is information handling systems. An information handling system ("IHS") generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, computing processing, database processing, gaming processing or communication processing. In addition, information handling systems may include a variety of hardware and software components that may be configured to process, store, and communicate information and may include one or more computer systems, data storage systems, and networking systems.

To reduce heat from an information handling system, cooling devices are provided for various heat generating components within the system. These cooling devices may be attached to the components for passive heat dissipation or located within proximity of the components to facilitate active heat removal from the components and the overall system. For example, a heat sink may be coupled to a processor to remove heat dissipated from the processor. As another example, a fan may be placed on a chassis or attached to a casing that is designed with selective vents. The fan and vents serve to actively remove heat from the system and bring in cooler ambient air flow for cooling the heat generating components and overall system. The information handling system typically operates with a single set of operating parameters, including a specific processor frequency, clock speeds, power setting, etc.

Recent designs of information handling systems rely on processors ("CPU") and graphic processors ("GPU") that can operate at varying elevated clock speeds. Systems designed for high CPU usage, such as gaming systems, often demand even higher performance, which requires the IHS operate at a clock frequency that is faster than is specified in the standard manufacturing parameters. Such fast operating frequency is called overclocking. Overclocking operations increase power consumption, causing the processor and system to generate more heat, which must be removed if the IHS and its components are to operate within the acceptable range of thermal operation. More sophisticated management of cooling devices is required as heat dissipation and power consumption increases with faster operating frequency.

BRIEF SUMMARY

Disclosed are a method and system for scaling performance of an information handling system based on information received from at least one cooling component within the system. The performance of the information handling system is scaled based on the type and cooling capability of the cooling component/s installed to remove heat from the system.

The method of scaling performance of an information handling system includes a controller receiving component data that identifies a heat removal effectiveness of a connected cooling component, selecting performance characteristics of the information handling system based on the received component data, and adjusting the operating parameters of the information system to achieve the selected performance characteristics, which correspond to the heat removal capability of the various components in the system. In furtherance of the identification of the heat removal effectiveness, the method includes mapping the component data to an entry within a look-up data structure, obtaining the performance characteristics from the entry, determining a corresponding adjustment of one or more operating parameters within the information handling system, and storing the selected performance characteristics and operating parameters within the BIOS for utilization during subsequent start-up of the system.

In one embodiment, when a new cooling component is detected and is not already mapped within the look-up data structure, the look-up data structure is updated to include an entry f containing the component data with new component identification and associated heat removal effectiveness of the new cooling component. Then, new applicable performance characteristics can be determined and/or selected based on the heat removal effectiveness and the particular component/s or device/s that is/are being cooled by the new cooling component. If the applicable performance characteristics require an adjustment of the operating parameters, the method includes readjusting the operating parameters to achieve the selected applicable performance characteristics.

The information handling system's performance may be automatically scalable with a selected performance characteristics based on the overall heat removal capability from at least one cooling component. The information handling includes a controller that is communicatively coupled to at least one cooling component via a signal bus over which the component data is transmitted from the cooling component. The cooling component has at least a cooling device and storage for storing the component data. The component data is transmitted to the controller when the cooling component is inserted into the information handling system.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

The above as well as additional objectives, features, and advantages of the present disclosure will become apparent in the following detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 5 illustrates an example block diagram of a look-up data structure correlating heat efficacy of various cooling components with respective system performance characteristics and operating parameters, in accordance with one embodiment.

DETAILED DESCRIPTION

Figure 1:
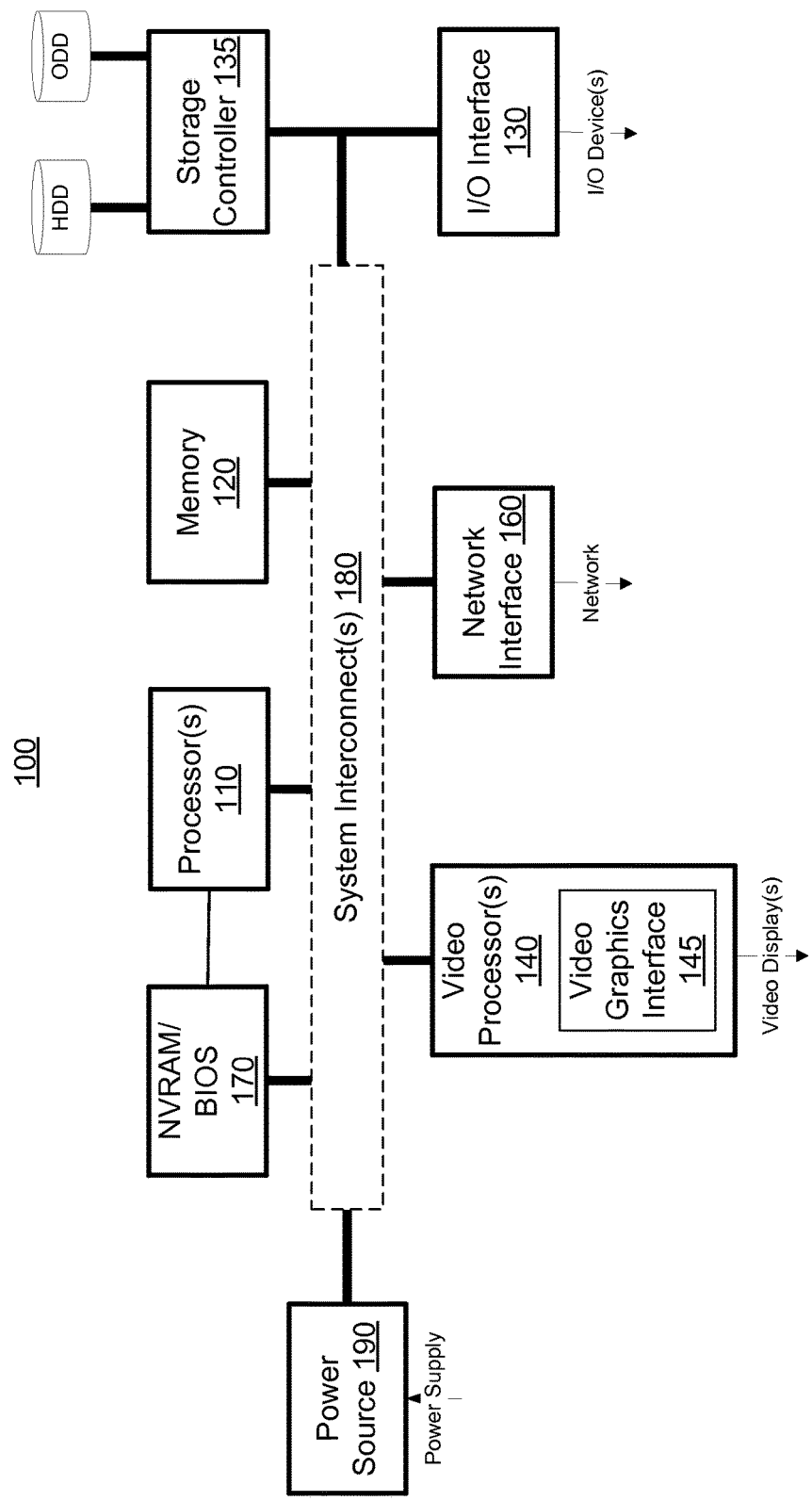
FIG. 1 provides a block diagram of an information handling system within which certain aspects of the disclosure can be practiced, according to one embodiment.

The illustrative embodiments provide a method and a system for scaling performance of an information handling system. The performance (e.g., frequency of operation) of the information handling system is scaled based on information received from at least one cooling component within the system about the cooling efficacy provided by the cooling component. Specifically, the performance of the information handling system is scaled based on the type and cooling capability of the cooling component/s installed to remove heat from the system.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Those of ordinary skill in the art will appreciate that the hardware components and basic configuration depicted in the following figures may vary. For example, the illustrative components within information handling system 100 are not intended to be exhaustive, but rather are representative to highlight essential components that are utilized to implement the present disclosure. For example, other devices/components may be used in addition to or in place of the hardware depicted. The depicted example is not meant to imply architectural or other limitations with respect to the presently described embodiments and/or the general disclosure.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments.

Various aspects of the disclosure are described from the perspective of an information handling system and a cooling component of or for use with an information handling system. For purposes of this disclosure, an information handling system, such as information handling system 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory ("RAM"), one or more processing resources such as a central processing unit ("CPU") or hardware or software control logic, ROM, and/or other types of nonvolatile memory. Additional components of the information handling system may include one or more disk drives, one or more network ports for communicating with external devices as well as various input and output ("I/O") devices, such as a keyboard, a mouse, and a video display. The information handling system may also include one or more buses operable to transmit communications between the various hardware components.

With reference now to the figures, and beginning with FIG. 1, there is depicted a block diagram representation of an example information handling system 100, within which one or more of the described features of the various embodiments of the disclosure can be implemented. Information handling system 100 includes at least one central processing unit ("CPU") or processor(s) 110 coupled to system memory 120 via system interconnect(s) 180. System interconnect(s) 180 can be interchangeably referred to as an interconnect chipset, in one or more embodiments. The system interconnect(s) 180 may support multiple processors, allow simultaneous processing by each of the processors and permit the exchange of information among the processors and other components of the information handling system 100. Also coupled to system interconnect(s) 180 is nonvolatile storage ("NVRAM") 170, within which can be stored one or more software and/or firmware modules, basic input/output system ("BIOS"), and one or more sets of data that can be utilized during startup operations of information handling system 100. These one or more software and/or firmware modules can be loaded into system memory 120 during operation of information handling system 100. Specifically, in one embodiment, system memory 120 can include therein a plurality of such modules, including one or more of firmware ("F/W"), basic input/output system ("BIOS"), operating system ("O/S"), and application(s). These software and/or firmware modules have varying functionality when their corresponding program code is executed by CPU 110 or secondary processing devices within information handling system 100.

IHS 100 further includes one or more input/output (I/O) interface 130 which supports connection by and processing of signals from one or more connected input device(s), such as a keyboard, mouse, touch screen, or microphone. I/O interface 130 also support connection to and forwarding of output signals to one or more connected output devices, such as a monitor or display device or audio speaker(s). Additionally, in one or more embodiments, one or more storage controller(s) 135, such as an optical reader, a universal serial bus (USB), a card reader, Personal Computer Memory Card International Association (PCMCIA) slot, and/or a high-definition multimedia interface (HDMI), can be associated with IHS 100. Storage controller 135 can be utilized to enable data to be read from or stored to corresponding removal storage device(s), such as a compact disk (CD), digital video disk (DVD), flash drive, or flash memory card. In one or more embodiments, storage controller 135 can further include General Purpose I/O interfaces such as $I^2C$, SMBus, and peripheral component interconnect (PCI) buses.

Information handling system 100 includes a network interface 160. Network interface 160 enables information handling system 100 and/or components within information handling system 100 to communicate and/or interface with other devices, services, and components that are located external to information handling system 100. These devices, services, and components can interface with information handling system 100 via an external network (not shown) using one or more communication protocols.

Information handling system 100 can also include at least one video processor(s) 140 having video graphics interface 145. Video graphics interface 145 can be utilized with applications requiring sophisticated graphics and computation of graphics and video. Video processor(s) 140 (and by extension video graphics interface 145) is connected to system interconnect(s) 180 and shares information within the information handling system. System interconnect(s) 180 can support multiple video processors 140. Graphics interface 145 is connected to an external video display, such as a flat panel or other type of display device. In at least one alternate embodiment, video processor(s) 140 can be a graphics processing unit (GPU) and can be collocated along with processor 110 on a processor chip.

Information handling system 100 draws regulated power from a power source 190. Power source 190 can in turn draw power from a power supply, such as an electrical outlet or by other means of receiving a supply of power. Power source 190 provides the required voltage regulation and current regulation to information handling system 100 and its components.

Information handling system 100 as describe in FIG. 1 includes multiple system components working together and has an overall maximum achievable performance with optimum operating parameters for the components. The information handling system 100 will become inoperable above the maximum achievable performance or optimum operating parameters.

Figure 2:
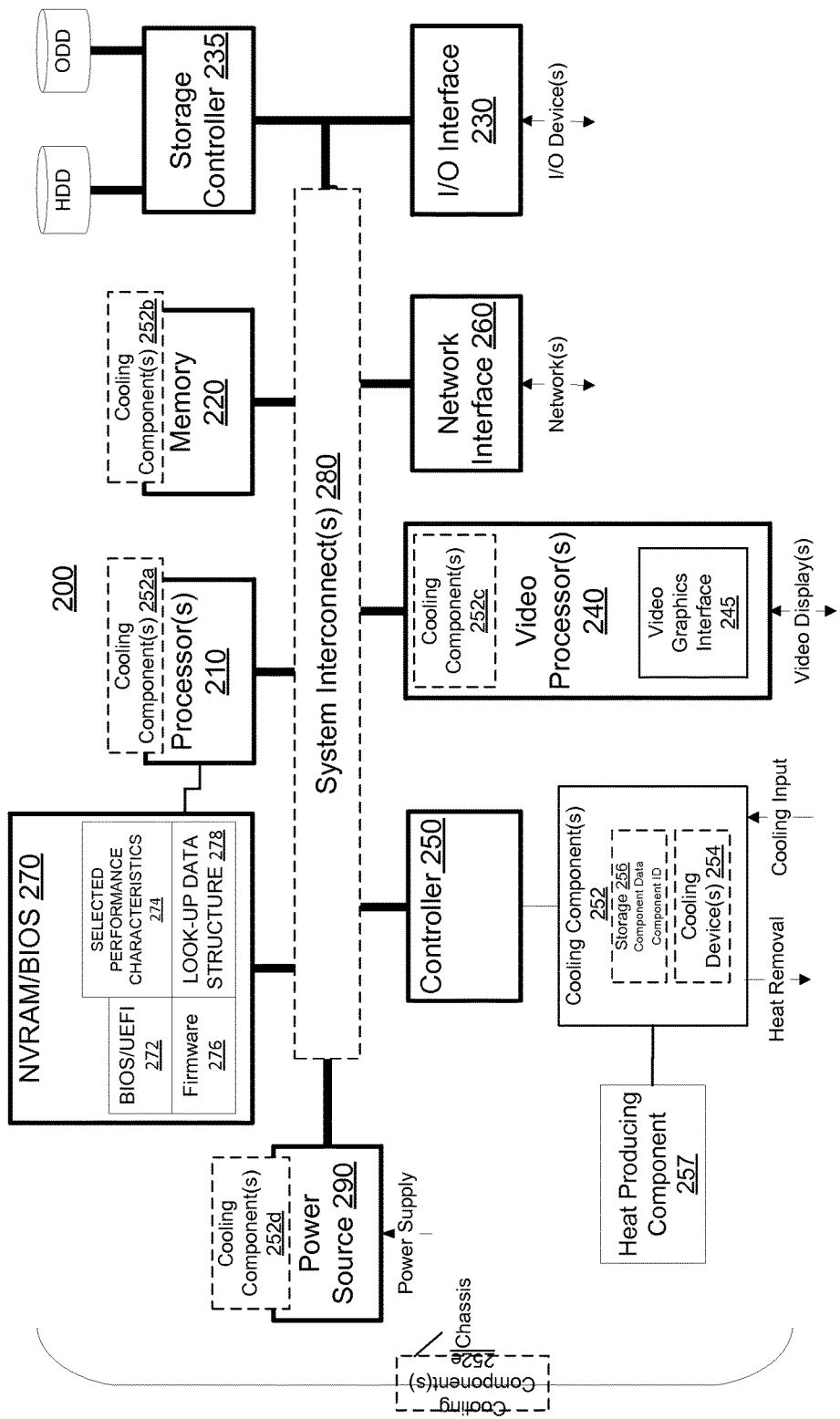
FIG. 2 illustrates an example block diagram of an information handling system with cooling components and a controller.

FIG. 2 illustrates a block diagram of an information handling system 200 having similar functional or operational core components as FIG. 1 and a plurality of cooling components 252*a-f* (collectively cooling component(s) 252) that are each utilized to cool or remove heat from respective ones of the core components. Cooling component(s) 252 is representative of any one of cooling components 252*a-f*. Information handling system 200 also includes a controller 250 that is configured to handle performance scaling based on which cooling component(s) 252 are provided within the information handling system and identify maximum achievable performance of the information handling system. The controller 250 identifies the limiting components within the information handling system and adjusts the maximum achievable performance accordingly. The maximum achievable performance provides the upper limits to the operating parameters of the components. While controller 250 is shown to have a distinct communication connection with at least one and potentially multiple of the cooling component(s) 252 present within the information handling system, controller 250 may have direct communication with each of cooling components 252*a-f*.

According to one aspect of the disclosure, at least one and potentially multiple of cooling components 252 includes cooling device(s) 254 and storage 256. Cooling device(s) 254 has the capability of removing heat from a first heat producing device (e.g., processor(s) 210), or from an area within the information handling system 200. Cooling component(s) 252 can also cool the heat producing device by delivering cooler air (i.e., air that has a lower temperature than the ambient temperature surrounding, or the surface temperature of, the device/s or component/s or area being cooled) to the heat producing device or surrounding area. By providing an isolated or directed cooling of one or more functional components or devices, cooling device(s) 254 effectively removes heat from the overall information handling system 200. Examples of cooling device(s) 254 includes but is not limited to a heatsink, a liquid cooler, a gas cooler, a bursting type of cooler, a heat pipe, a vent, and a fan.

Storage 256 contains component identification (ID) and/or at least component data for identifying a heat removal effectiveness of the cooling component 252*a*. In one embodiment, component data 258 also includes component ID. The component ID can act as a pointer to a set of data corresponding to the cooling device(s) 254, such as operating parameter of the cooling device(s) 254, heat removal capability, location within the information handling system, and other significant data that can be utilized for selecting performance characteristics of the information handling system. In one embodiment, component data also includes component ID. It is appreciated that the component data may also include data of heat producing component 257 and other significant components in the information handling system that affect the heat dissipation parameters. It is appreciated that not all cooling components within information handling system 200 will necessarily have or be designed with storage and/or be capable of providing component data. Implementation of the described functional aspects of the disclosure can be implemented within a system having only a single cooling component configured to provide component data to the controller 250, where that cooling component(s) 252 is interchangeable within the information handling system 200 with other cooling component(s) 252 that can provide different cooling characteristics.

Within the illustrated example, each cooling device(s) 254 is illustrated as being associated with and thus collocated relative to at least one specific heat producing device that produces heat dissipation within the information handling system 200. For purposes of illustration, example heat producing devices include, but are not limited to, processor(s) 210, memory 220, video processor(s) 240, controller 250, and power source 290. Each of the heat producing devices has a corresponding heat dissipation parameter, which can be variable depending on operational mode of one or more of the devices or the information handling system as a whole. The amount of heat dissipated within the information handling system 200 affects the performance of specific ones of the functional devices and of the information handling system as a whole. Another performance factor that has a bearing on the amount of heat dissipation and/or is affected by the heat removal efficacy of the cooling component(s) 252 is the operating mode of the heat producing device. For example, processor(s) 210 can be operable at a frequency range of 2000 MHz to 4500 MHz. As the frequency increases, the heat dissipation increases, thus requiring better cooling solution at higher frequency. The frequency of processor(s) 210 is variable and scalable based on the systems ability to maintain operational temperatures within pre-established ranges to prevent component overheating and/or system failure. According to one aspect of the disclosure, the controller 250 identifies the detected heat removal efficiency of the various cooling components installed within the system and can trigger operation of the processor(s) 210 at higher frequencies when the heat removal efficiency of all of the cooling components supports the higher frequency operation. It is appreciated that while certain components of the information handling system 200 are shown provided with a respective cooling component 252 to remove the dissipated heat from the particular component, different systems can include other components or a different set of components that have assigned cooling components, and implementation of the concepts described herein are not limited to those components shown in FIG. 2.

FIG. 2 further illustrates an exemplary nonvolatile storage 270 configured with BIOS 272, selected performance characteristics 274, look-up data structure 278, and scaling performance firmware 276. While nonvolatile storage 270 can hold other computer code, FIG. 2 concentrates on the codes for performance scaling of the information handling system 200. Look-up data structure 278 is essentially a table of data that maps cooling device IDs with their respective cooling efficiency parameter value. In the illustrated embodiment, look-up data structure 278 also includes, for each entry of cooling device ID, specific performance characteristics and associated operating parameters in order to enable the performance characteristics. The selected performance characteristics 274 and associated operating parameters are saved in the BIOS 272 or nonvolatile storage 270 or other nonvolatile storage in the system that are accessible by the BIOS 272 during startup. These saved values are then utilized during subsequent startup of the information handling system 200 to determine the operational mode of one or more functional devices and/or the overall information handling system 200. At system startup, the saved performance characteristics data are used to enable the associated performance scaling of the information handling system 200.

Figure 3:
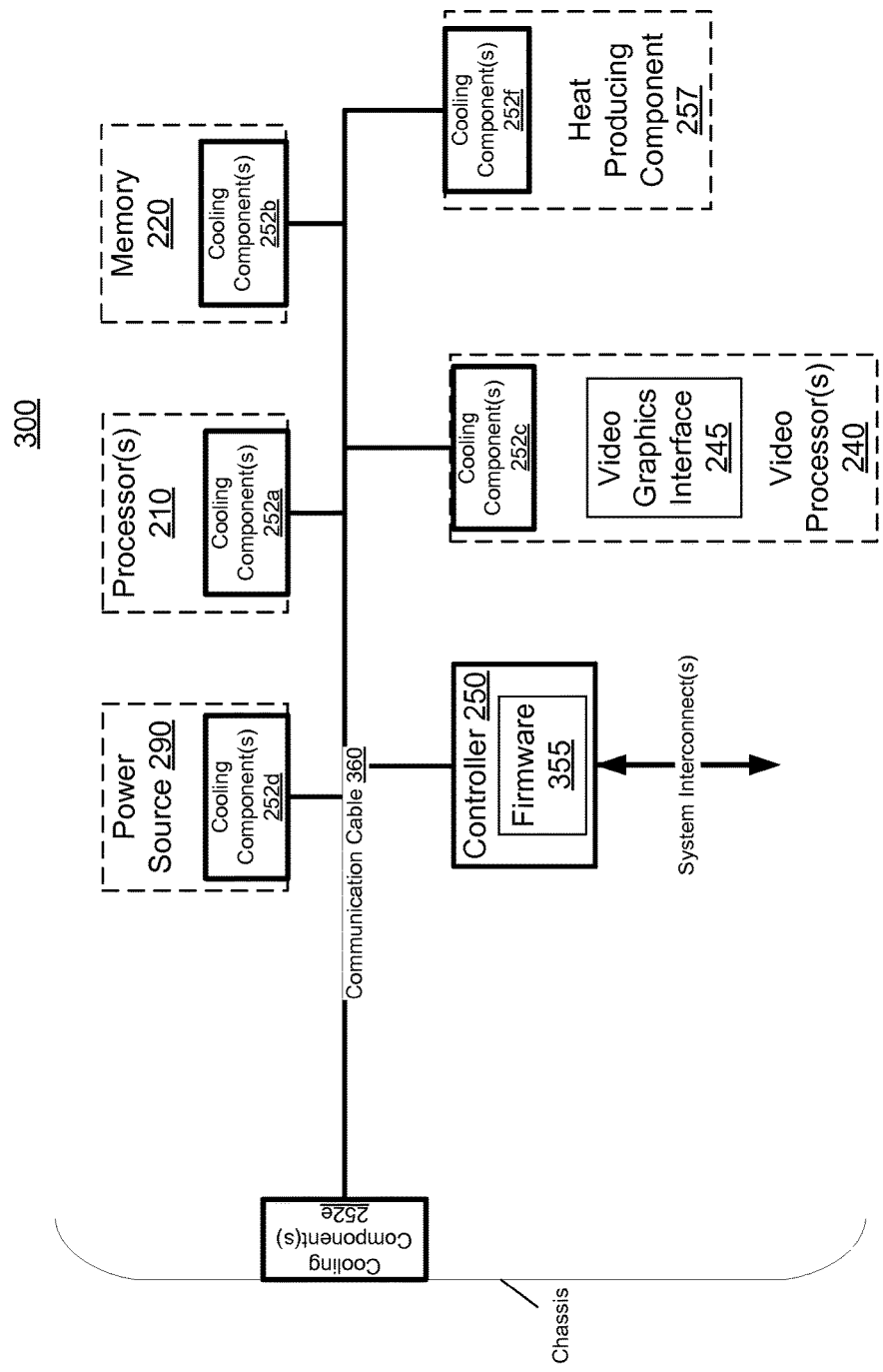
FIG. 3 illustrates an example block diagram depicting a communication cable interconnecting a controller and cooling components of an information handling system.

FIG. 3 illustrates controller 250 communicatively coupled to multiple cooling components 252*a-f*, some or all of which can be interchanged for other cooling components having different cooling effectiveness. Controller 250 is coupled to at least one of the cooling components 252*a-f* via communication cable 360. The communication cable 360 includes a signal bus which can be a serial or parallel communication channel. While the communication cable 360 is depicted as a dedicated communication bus between cooling component 252*a-f* and controller 250, the signal bus may be shared with other existing interface like an I/O interface. The serial communication channel may be compatible with an I2C bus or other serial or parallel communication protocol. As an additional aspect of the disclosure, each cooling component has local storage 256 (FIG. 2). Controller 250 reads, via the signal bus, the register(s) storing component data within storage 256 of cooling component(s) 252 to retrieve the component identifier and cooling efficacy parameter of each cooling device. Controller 250 receives the component data from cooling component(s) 252 that are designed with a mechanism for communicating such data to controller 250, and controller 250 utilizes this data from the various cooling components to select performance characteristics in order to provide the appropriate performance scaling of the information handling system, corresponding to the determined overall heat dissipation and heat removal capability of the system. Controller 250 further includes firmware 355 which resides in local nonvolatile storage and which configures controller 250 to perform several of the various functional features described herein.

In an illustrative embodiment, controller 250 is communicatively coupled to one cooling component 252a while some of the cooling components are not installed or another does not have direct communication over communication cable 360. The example cooling component 252a is designed with either a connecting port for connecting a communication cable thereto or an attached communication cable 360 extending from the cooling component 252a to enable cooling component 252a to interconnect and interface with controller 250 and potentially other components in information handling system 300. Communication cable 360 includes at least one signal bus over which the cooling component 252a transmits component data to the controller 250 when the cooling component 252a is connected to and/or made operational within the information handling system 300. Cooling component 252a is coupled to controller 250 over communicable cable 360. In the illustrated embodiment, cooling component 252a is also thermally attached to processor(s) 210 and is thereby capable of removing heat from processor(s) 210 and the information handling system. Cooling component 252a can, in alternate embodiments, be located physically apart from processor(s) 210 but designed to provide the required cooling effects for processor(s) 210.

In another illustrative embodiment, cooling component 252a is directly coupled to controller 250, while other cooling components (e.g., 252b-f) can be indirectly coupled over system interconnect(s) 280 (FIG. 2). It is appreciated that the communication cable 360 can be utilized to also provide power to cooling component(s) 252 as well as provide other forms of control signals to cooling component(s) 252. Further, while described as a signal bus, the communication of the component data can be via multiple signal busses within a more complex multi-bus communication cable 360.

Figure 4:
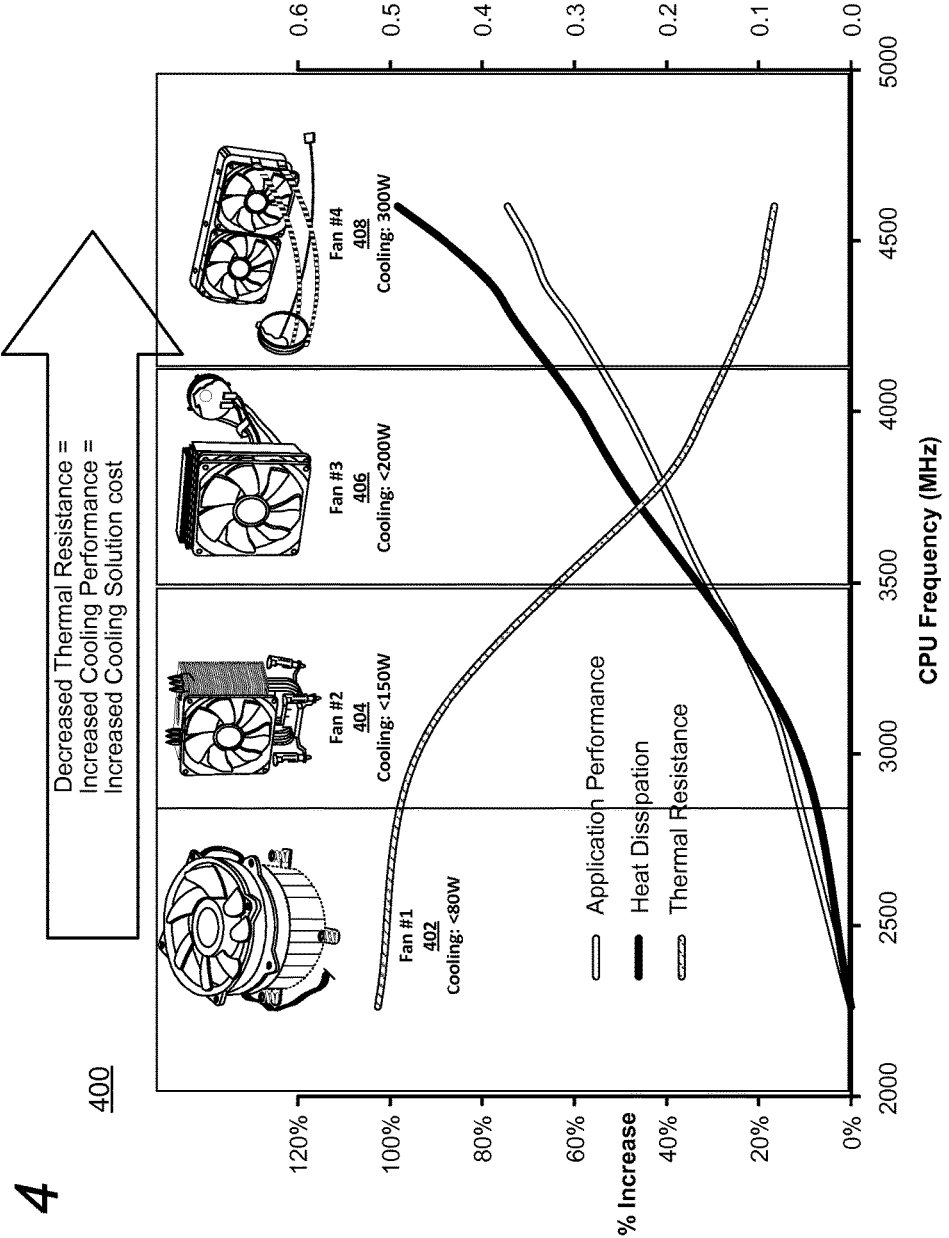
FIG. 4 provides an example graph illustrating scaling of system performance with respect to CPU frequency, heat dissipation and thermal resistance with four interchangeable fans having different heat removal capability.

FIG. 4 provides a chart 400 depicting an overview of application performance measured by percent increase with corresponding heat dissipation, thermal resistance in C/W (Celsius degrees per Watt), and CPU frequency in MHz when one of four different cooling components are provided within the information handling system to cool the processor(s) 210. The four depicted cooling components, which are different types of fans, each have a different cooling efficiency parameter or value. First cooling component 402 has cooling efficacy parameter of less than 80 Watts (W), second cooling component 404 has cooling efficacy parameter of less than 150 W, third cooling component 406 has cooling efficacy parameter of less than 200 W, and fourth cooling component 408 has cooling efficacy parameter of up to 300 W. Each cooling component (402-408) has a connective cabling that communicatively couples the cooling component to a controller 250 when the particular selected cooling component is inserted within information handling system. Each cooling component (402-408) includes component data which is read by or transmitted to controller 250 when the cooling component is inserted into the system and powered on. Because any one of these cooling components 402-408 can be selected for insertion within information handling system, the cooling components 402-408 are described as being interchangeable, relative to each other and within the system. It is appreciated that the manufacturer of the information handling system or an end customer can select which of the different available cooling components to insert within the information handling system. In the described embodiments, the decision on which cooling component is selected can be based on one or both of desired operating performance of the information handling system and cost.

In the example of FIG. 4, the processor 210 has a functioning frequency parameter between 2250 MHz to 4500 MHz. Processor 210 represents a CPU that dissipates increasingly more heat as the operational frequency increases. The processor's manufacturer provides a heat dissipation parameter for processor 210 and that information is made available to or stored as data within firmware 355 of controller 250 or within BIOS 272 (FIG. 3). From the heat dissipation parameter, one of four interchangeable fans is elected to cool processor(s) 210 of the information handling system, with each fan corresponding to four incrementing ranges of operating frequency of the processor(s) 210. At the lowest spectrum of the frequency range, around 2250 MHz to 2750 MHz, the processor(s) 210 has the highest estimated thermal resistance of 0.5 C/W. The heat dissipation of processor(s) 210 is at the lowest level, as is the application performance. At this lowest frequency range where the processor operates at 2750 MHz or lower, fan #1 402 with cooling capacity of 80 W can adequately cool the processor(s) 210. From a cost standpoint, the use of fan #1 402 may represent the least expensive cooling solution. As the interchangeable fans are switched, the operating frequency of processor(s) 210 can be changed accordingly, and the operating parameters of the processor(s) 210 and other components are adjusted by controller 250 to account for the currently inserted fan and the corresponding heat removal capability of the fan at the selected CPU frequency.

For example, to increase the application performance from 15% to 30%, the frequency of the processor(s) 210 has to be increased from the frequency range of 3000 MHz up to 3500 MHz. With increase of performance and frequency, the thermal resistance decreases from 0.5 C/W to 0.3 C/W while the heat dissipation increases and the application performance increases. Fan #2 404 has cooling capacity of up to 150 W, about twice the cooling capacity of fan #1 402. To increase the application performance from 35% to 70%, the frequency range has to be increased to between 3500 MHz and 4100 MHz. Thermal resistance decreases to about 0.3 C/W to 0.15 C/W. Operation at this frequency requires fan #3 406, which has a cooling capacity up to 200 W. At this performance range, the thermal resistance crosses with the application performance at around the 40% increase mark or 3750 MHz. To increase the application performance to above 70% up to a maximum of 100%, the required frequency ranges from 4100 MHz to 4500 MHz, approximately twice the rate of the lowest frequency. At this operating frequency, the estimated thermal resistance decreases drastically to 0.1 C/W. Operation at this frequency requires fan #4 408, which has a highest cooling capacity of about 300 W to adequately remove the increased heat dissipation. At the highest range of performance, processor(s) 210 may be operating in an overclocking mode, requiring the most efficient cooling solution as the thermal resistance is nearly zero. In summary, as the application performance is increased, the heat dissipation also increases with the application performance. The thermal resistance decreases. It is appreciated that depending on the exact fan solution employed within the information handling system, the cost of the cooling solution can increase in multiples (e.g., six to eight times) for twice the performance.

With continuing reference to FIGS. 2-3 and the example chart of FIG. 4, as the fans having greater cooling capacity are added for cooling the processor, the fans and processor(s) consume additional amounts of power from power supply and thus, additional heat removal capacity can be required for power source 290. Thus, the increased operational performance at the higher frequencies increases not only the heat dissipation of processor(s) 210, but can also significantly increase the heat dissipation of power source 290 which delivers the increased amount of power to the system. Similarly, as the processing frequency increases, the number of memory access operations would necessarily increase as the processor requires more instructions and data per time cycle at the elevated/higher processing frequency. Thus, the memory and storage devices would also need additional cooling as the increased operations would lead to greater heat dissipation. The information handling system would require more power delivery as well as greater cooling capabilities at a higher operating frequency. Expanding the analysis of additional heat dissipation in a wider scope, almost all of the main functional components in the information handling system will require at least an increase of power, voltage, or current delivery, resulting in increased heat dissipation from the components, thus requiring greater cooling efficacy of the installed cooling components. It is appreciated that in the practical implementation, it is the availability of the greater cooling efficacy that drives whether or not the functional devices are permitted to operate at the higher operational states, and the overall determination of which operational parameters can be provided for the devices can be performed by firmware 355 of controller 250 utilizing look-up data structure 278. Look-up data structure 278 may be stored in the nonvolatile storage of controller 250 or other nonvolatile storage within the information handling system.

FIG. 5 provides an example of a look-up data structure 278 which includes separate entries for each of the cooling components (fans) 402-408 charted within FIG. 4. It is appreciated that a more elaborated data structure with unique data for a specialized information handling system can be implemented, in other embodiments. For each recognized cooling component, look-up data structure 278 includes an entry that provides component data, such as and/or including component identification, heat removal capability, maximum achievable performance, and operating parameter limits. Additionally, within one or more of the entries, look-up data structure 278 may also contain precalculated or empirically determined information, such as overall heat removal capability, overall heat dissipation performance characteristics, and operating parameters corresponding to the performance characteristics supported when the particular cooling component is provided within the information handling system. It is appreciated that look-up data structure 278 may also include heat dissipation parameters and operating parameters of specific components within the information handling system. These additional parameters can be integral in the performance scaling operations in accordance with the selected performance characteristics. In another method, the overall heat removal capability and overall heat dissipation of the information handling system may be determined or calculated by enabling firmware 355. The performance characteristics and operating parameters are also selectable by executing code of firmware 355 or BIOS/UEFI 272.

Referring now to the second column of look-up data structure 278, fan #1 402 is provided as the component identification of cooling device, with heat removal capacity having an entry indicating less than 80 W. Once the component identification is located within an entry of data structure 278, firmware 355 can read other values mapped to that entry by reading down the column of data structure 278. Thus, fan #1 is utilized to cool a heat producing component with heat dissipation of 60 W, and the entry further maps fan #1 to (i) overall heat removal capacity of the information handling system of <80 W, (ii) overall heat dissipation of 70 W, (iii) performance characteristics of 2250-2750 MHz, and (iv) selected operating parameters of 2500 MHz. Similarly fan #2, fan #3, and fan #4 each have a corresponding entry mapping the above types of data for scaling performance of the associated functional device (with varying heat dissipation at different levels of performance) and/or the overall system.

Turning now to the last column of the lookup data structure 278, fan #1 is assisted with an auxiliary fan. Fan #1 removes heat from the system and the auxiliary fan draws in cooler air into the system, whereby the removal capacity is increased from 80 W for fan #1 to 87 W for the sum of fan #1 and the auxiliary fan (80 W+7 W=87 W). Accordingly, the selected operating parameter is increased from 2500 MHz to 3000 MHz. Fan #1 and auxiliary fan work together to increase the overall heat removal capability to 100 W which is above the sum of the individual heat removal capability of 87 W from fan #1 (80 W) and auxiliary fan (7 W). Fan #1 and auxiliary fan together illustrates the increase of the overall heat removal capability, where the whole is greater than the sum of its individual parts.

Figure 6:
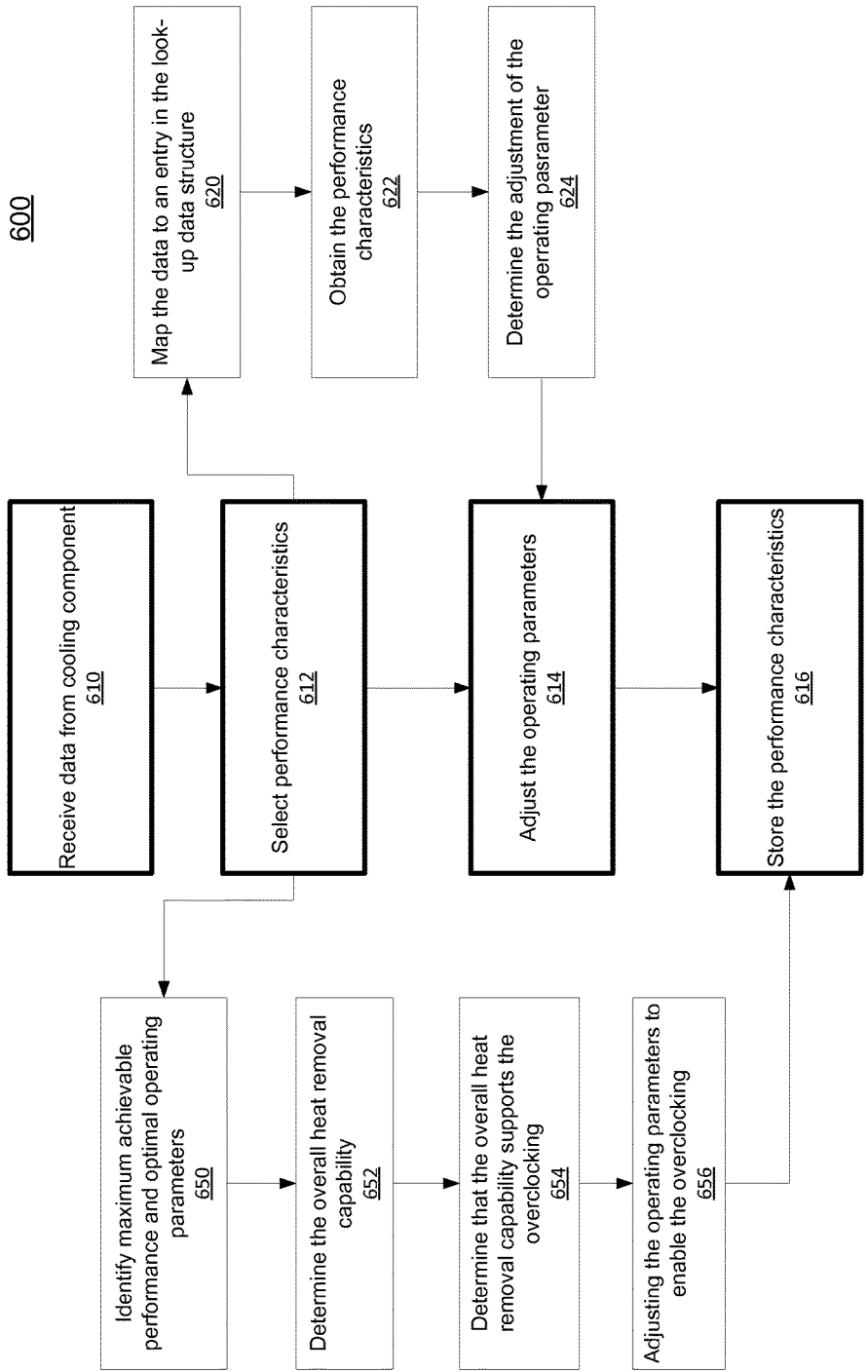
FIG. 6 is a flow chart illustrating processes within a method for scaling information handling system performance, according to one embodiment.

FIG. 6 is a flow diagram illustrating an embodiment of method 600 of scaling performance of an information handling system based on detected heat removal capabilities of at least one cooling component provided within the information handling system. It is appreciated that when the information handling system is first powered on or during a startup operation, BIOS detects whether a new device is installed in the system. If no new device is installed or exchanged from a previous power-on operation (e.g., power on self-test), the system continues the startup operation with preexisting saved performance characteristics. When a new device is installed for cooling, controller 250 receives component data from the newly installed or interchanged cooling component(s) 252, the data identifies the heat removal effectiveness of cooling component(s) 252 (block 610). The received data is analyzed or mapped within the data structure 278 in order to select associated performance characteristics of the information handling system (block 612). The selection of the performance characteristics is based in part on the received component data and corresponding heat removal effectiveness of cooling component(s) 252. As shown within method 600, the selection process can include mapping the component data in block 620 to an entry within a look-up data structure 278 having entries of component data and heat removal capability for a list of known cooling component(s) 252. Look-up data structure 278 maps cooling components utilized by the information handling system with applicable performance characteristics. Therefore, the information handling system can support multiple interchangeable cooling component(s) 252 that require or enable different performance characteristics. Each different interchangeable cooling component(s) 252 can have different heat removal capability, in one embodiment. The selection of performance characteristics is in part based on the heat removal capability of installed cooling component(s) 252.

Referring again to the figure, the performance characteristics of the information handling system are obtained in block 622. The controller 250 then determines in block 624 which operating parameters should be adjusted to meet the cooling requirement at the selected performance characteristics. Adjustment of the operating parameters may include the adjustment of different operational modes of (i) the cooling component(s) 252, (ii) the heat producing component, which affects the heat removal effectiveness of cooling component 252, and (iii) other components in the information handling system. In block 614, the operating parameters are adjusted accordingly. The selection of performance characteristics, the determination of whether an adjustment of the operating parameters are required, and the specific adjustments of the operating parameters may be obtained from the look-up data structure 278 or by execution of firmware 355 or a combination thereof. As presented in block 616, the selected performance characteristics, including the corresponding adjustments to the operating parameters that are determined by controller or retrieved from the data structure 278, are stored in the basic input output system ("BIOS") or nonvolatile storage for utilization during subsequent startup of the information handling system. The operating parameters can include clock frequency, power setting, voltage setting, current setting, and phase frequency for one or more functional components in the information handling system. It is appreciated after the adjustment of the operating parameters and the performance characteristics are saved for subsequent startup operation, the information handling system may be triggered to restart, such that the information handling system will restart with the updated performance characteristics.

In a specific embodiment, the operating parameters may be adjusted to support overclocking when the overall heat removal effectiveness of the overall system, and in particular for each of the components affected by increased processing at the overclocking rates, is above a minimum threshold required for overclocking. Overclocking allows high performance of a processing system or processor by increasing the operating frequency, often above the manufacturing parameters. Too much overclocking of the system without the appropriate cooling risk damage to the processing devices and overall system due to excessive heat dissipation. Furthermore, overclocking is limited by the maximum achievable performance which defines the upper limits of the operating parameters of the components in the information handling system. Controller 250 identifies in block 650 the maximum achievable performance and the optimal operating parameters through firmware calculation or retrieval from the lookup data structure 278 or a combination thereof. In order to operate at the overclocking mode, the adjusted operating parameters must support an overall heat removal capacity that keeps up with a corresponding heat dissipation parameter. When the heat removal effectiveness of each cooling component 252 is above the required threshold for overclocking, the combined heat removal effectiveness results in a corresponding dissipation parameter of the information handling system that supports overclocking. Using the received component data, controller 250 determines in block 652 the capacity of overall heat removal of the information handling system. When the overall heat removal capability is determined in block 654 to support overclocking mode, the operating parameters is adjusted to enable the overclocking as indicated in block 656. The selected performance characteristics with operating parameters are saved in the BIOS for subsequent start-ups. An initial restart of the system may be triggered if the new cooling component is hot-plugged into an already booted-up system.

Figure 7:
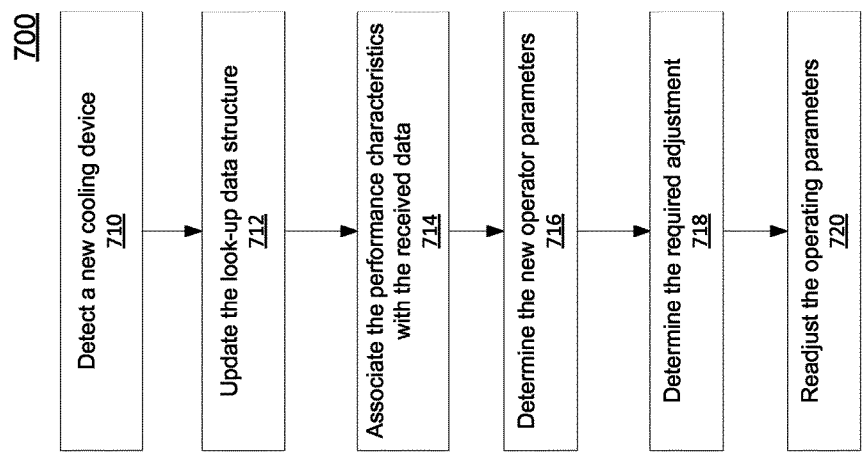
FIG. 7 is a flow chart illustrating processes within a method for scaling information handling system performance, when a detected cooling device is not identified within an entry of the look-up data structure, in accordance with one embodiment.

FIG. 7 is a flow diagram illustrating an embodiment of method 700 of scaling performance of an information handling system when an unrecognizable cooling device is installed in the information handling system (i.e., a cooling device that is not already identified within an entry of the data structure). It is appreciated that the firmware causes the controller to update the data structure and ascertain or determine corresponding new performance characteristics. When the component data of the new cooling component is received, controller 250 attempts to map the component data to an existing entry of the look-up data structure 278. If the controller determines that the received component data does not match with a data entry of the look-up data structure, the controller identifies the installed cooling component as a new device that is not currently supported within the look-up data structure (block 710). At block 712, controller 250 updates the look-up data structure 278 with a new entry for at least the new component data, which includes the new component identification and associated heat removal capability. Additional performance data, such as the cooling capabilities of the cooling component and other system level performance characteristics are either obtained from the component data stored in the component storage 256 or determined by execution of firmware 355. For example, firmware 355 may utilize the component ID retrieved from component data to search for additional information about the cooling device from an external database to which information handling system is communicatively connected. According to one aspect, execution of firmware causes controller to perform an algorithm or routine that updates system data such as the performance characteristics capable of being supported within the information handling system based, at least in part, on the cooling capabilities retrieved from the component data of the cooling component. At block 714, controller 250 associates the applicable performance characteristics with the new component data and updates the entry of the look-up data structure. Next, armed with the applicable processing characteristics, controller 250 determines new operating parameters, in block 716, corresponding with the applicable performance characteristics for the information handling system. Then in block 718, controller determines operating parameters that requires adjustment. The operation/s of cooling component 252 and affected heat producing device/s are readjusted or modified in block 720 when the determined operating parameters are different from the current operating parameters.

Figure 8:
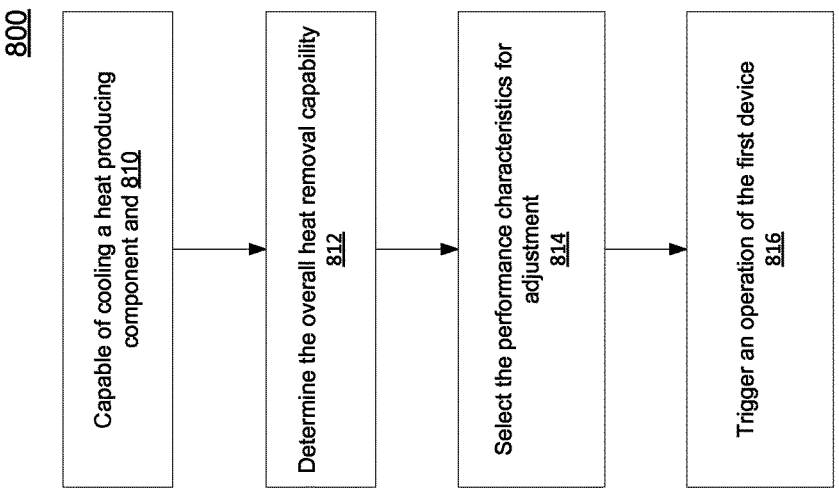
FIG. 8 is a flow chart illustrating processes within a method for scaling information handling system performance at the system start-up based on the heat removal capability of the detected cooling systems installed within the information handling system, according to one embodiment.

FIG. 8 illustrates another description of the method 800 for scaling performance utilizing a cooling device capable of removing heat from the information handling system. Cooling device 254 is coupled in block 810 to a first device and cools or removes heat from at least the first device. The first device includes at least a heat producing component with a heat dissipation parameter. After receiving the component identification and heat removal efficacy parameter from cooling component 252 and heat dissipation parameter for the first device, the overall heat removal capability is determined for the information handling system (block 812). Next, the performance characteristics are selected in block 814 based on the overall heat removal capacity. Selecting performance characteristics for adjustment may include associating operation of components within the information handling system are with operating parameters to enable the operating mode specific to the selected performance characteristics. The operation of the first device is triggered based on the performance characteristics (block 816).

In the above described flow charts, one or more of the method processes may be embodied in a computer readable device containing computer readable code such that a series of steps are performed when the computer readable code is executed on a computing device. In some implementations, certain steps of the methods are combined, performed simultaneously or in a different order, or perhaps omitted, without deviating from the scope of the disclosure. Thus, while the method steps are described and illustrated in a particular sequence, use of a specific sequence of steps is not meant to imply any limitations on the disclosure. Changes may be made with regards to the sequence of steps without departing from the spirit or scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a GPU, or other programmable data processing apparatus to produce a machine, such that the instructions, which execute via the processor of the computer or other programmable data processing apparatus, performs the method for implementing the functions/acts specified in the flowchart and/or block diagram block or blocks.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of scaling performance of an information handling system, the method comprising:

reading, by a controller, from a local storage of an installed cooling component to which the controller is communicatively connected via a signal bus, at least one component data that identifies a heat removal effectiveness of the installed cooling component;

selecting, by the controller, one or more performance characteristics of the information handling system based on the received component data and corresponding heat removal effectiveness of the installed cooling component, by mapping the component data to an entry within a look-up data structure, the look-up data structure located within a nonvolatile storage and accessible by a basic input output system (BIOS) of the information handling system during a system start-up process, wherein the look-up data structure includes an entry for a first fan that removes heat from the system operating with an auxiliary fan that draws in cooler air into the system, wherein the first fan and auxiliary fan work together to increase an overall heat removal capability by an amount greater than a sum of each individual heat removal capability;

adjusting, by the controller, one or more operating parameters of the information handling system to achieve the selected one or more performance characteristics, wherein the performance characteristics are related to the heat removal effectiveness associated with the component data retrieved from the storage of the installed cooling component;

wherein an overall heat removal capacity, inclusive of the heat removal effectiveness of the installed cooling component, results in a corresponding heat dissipation parameter of the information handling system that supports overclocking;

identifying, by the controller, a maximum achievable performance of the information handling system;

determining, from the component data, a corresponding adjustment in the overall heat removal capability within the overall information handling system;

determining that the overall heat removal capability within the overall information handling system supports the overclocking; and in response to determining that the overall heat removal capability supports overclocking:

selecting the applicable performance characteristics of the information handling system based on the overall heat removal capability and the maximum achievable performance; and adjusting the operating parameters of the information handling system to enable the overclocking.

2. The method of claim 1, wherein:

the information handling system supports multiple different interchangeable cooling components, each having an associated component data that identifies a heat removal capability of that cooling component, the heat removal capability being different across the multiple different interchangeable cooling components, the cooling component selected based on a desired operation performance;

the performance characteristics of the information handling system are selectable based on the heat removal capability of an available cooling component and are further selectable based on the maximum performance of the information handling system;

the performance characteristics include one or more operating parameters from among a clock frequency, a power setting, a voltage setting, a current setting, and a phase frequency; and the method further comprises:

obtaining the performance characteristics from the entry within the look-up data structure; and determining, based on the performance characteristics, a corresponding adjustment in at least one operating parameter within the information handling system.

3. The method of claim 1, further comprising:

storing the selected performance characteristics within a basic input output system (BIOS) for utilization during subsequent start-up of the information handling system.

4. The method of claim 3, wherein the adjusting of the one or more operating parameters comprises triggering the subsequent startup if an adjustment of the one or more operating parameters requires a restart of the information handling system.

5. The method of claim 1, further comprising:

detecting a new cooling component within the information handling system;

determining that a read component data from the new cooling component is not currently included within a look-up data structure that maps cooling components utilized by the information handling system with applicable performance characteristics;

updating the look-up data structure with the received component data, including a new component identification and an associated heat removal effectiveness value.

6. The method of claim 5, further comprising:

selecting the applicable performance characteristics of the information handling system based on the heat removal effectiveness value of the new cooling component;

associating, within the look-up data structure, the applicable performance characteristics for the information handling system with the received component data;

determining one or more operating parameters from among a clock frequency, a power setting, a voltage setting, a current setting, and a phase frequency that are affected by the applicable performance characteristics;

determining, based on the applicable performance characteristics, whether a corresponding adjustment is required in at least one active operating parameter of the information handling system; and when at least one active operating parameter requires an adjustment, readjusting one or more operating parameters of the information handling system to achieve the selected applicable performance characteristics.

7. The method of claim 1, wherein:

the cooling device cools at least a first device having a heat dissipation parameter that affects one or more performance characteristics of the information handling system; and the at least one component data comprises a component identification and a heat removal efficacy parameter.

8. The method of claim 7, further comprising:

determining a corresponding adjustment in an overall heat removal capability within the information handling system from the component data and the heat dissipation parameter of the first device;

selecting one or more performance characteristics of the information handling system based on the corresponding adjustment in the overall heat removal capability within the information handling system; and triggering an operation of at least the first device in an operating mode that is associated with the selected one or more performance characteristics of the information system.

9. An information handling system comprising:

a central processing unit;

at least one cooling component that comprises at least a cooling device and a local storage for storing at least one component data that identifies a heat removal effectiveness of the cooling component; and a controller capable of communicating with the cooling component to read the at least one component data from the local storage and which selects a performance characteristics of the information handling system based at least in part on the received component data, wherein an overall heat removal capacity, inclusive of the heat removal effectiveness of the cooling component, results in a corresponding heat dissipation parameter of the information handling system that supports overclocking, and the controller:

identifies a maximum achievable performance of the information handling system;

determines, from the component data, a corresponding adjustment in the overall heat removal capability within the overall information handling system, by mapping the component data to an entry within a look-up data structure, the look-up data structure located within a nonvolatile storage and accessible by a basic input output system (BIOS) of the information handling system during a system start-up process, wherein the look-up data structure includes an entry for a first fan that removes heat from the system operating with an auxiliary fan that draws in cooler air into the system, wherein the first fan and auxiliary fan work together to increase an overall heat removal capability by an amount greater than a sum of each individual heat removal capability;

determines that the overall heat removal capability within the overall information handling system supports the overclocking; and in response to determining that the overall heat removal capability supports overclocking:

selects the applicable performance characteristics of the information handling system based on the overall heat removal capability and the maximum achievable performance; and adjusts the operating parameters of the information handling system to enable the overclocking.

10. The information handling system of claim 9, wherein the cooling component further comprises a signal bus communicatively connected to the controller and over which the component data is read by the controller.

11. The information handling system of claim 9, wherein:

the cooling device cools at least a first device having a heat dissipation parameter that affects one or more performance characteristics of the information handling system, the cooling component selected based on a desired operation performance; and the at least one component data comprises a component identification and a heat removal efficacy parameter.

12. The information handling system of claim 9, wherein:

the cooling device is capable or removing heat from and cooling the information handling system; and the cooling device comprises at least one of a heatsink, a liquid cooler, a gas cooler, a bursting type of cooler, a heat pipe, a vent, and a fan.

13. The information handling system of claim 9, wherein the controller is communicatively connected with the cooling component and includes firmware that executes on the controller to configure the controller to:

read, from the cooling component, at least one component data that identifies a heat removal effectiveness of the cooling component;

select one or more performance characteristics of the information handling system based on the received component data and corresponding heat removal effectiveness of the cooling component; and adjust one or more operating parameters of the information handling system to achieve the selected one or more performance characteristics, wherein the performance characteristics are related to a heat removal capability of the information handling system.

14. The information handling system of claim 13, wherein:

the performance characteristics of the information handling system are selectable based on the heat removal capability of an available cooling component and correspond to one or more operating parameters from among a clock frequency, a power setting, a voltage setting, a current setting, and a phase frequency; and the controller is further configured to:

obtain the performance characteristics from the entry within the look-up data structure; and determine, based on the performance characteristics, a corresponding adjustment in at least one operating parameter within the information handling system.

15. The information handling system of claim 13, wherein the firmware further configures the controller to:

store the selected performance characteristics within a non-volatile storage accessible by a basic input output system (BIOS) for utilization during subsequent start-up of the information handling system.

16. The information handling system of claim 13, wherein:

after a new cooling component is installed in the information handling system, the controller is further configured to:

detect the new cooling component within the information handling system;

determine that a received component data from the new cooling component is not currently supported within a look-up data structure that maps cooling components utilized by the information handling system with applicable performance characteristics; and update the look-up data structure with the received component data, including a new component identification and an associated heat removal effectiveness.

17. The information handling system of claim 16, wherein:

the new applicable performance characteristics of the information handling system are selectable based on the associated heat removal capability of the new cooling component and correspond to one or more operating parameters from among a clock frequency, a power setting, a voltage setting, a current setting, and a phase frequency; and the controller is further configured to:

determine, based on the new applicable performance characteristics, a corresponding adjustment in at least one operating parameter of the information handling system;

associate, within the look-up data structure, the one or more new applicable performance characteristics for the information handling system with the received component data; and readjust one or more operating parameters of the information handling system to achieve the selected one or more new applicable performance characteristics.

18. The information handling system of claim 13, wherein:

the corresponding adjustment of the operating parameters enables overclocking of the information handling system, which overclocking yields a corresponding heat dissipation parameter; and an overall heat removal capacity of cooling components provided within the information handling system supports the corresponding heat dissipation parameter of the information handling system.

19. A cooling component designed for insertion in an information handling system to remove heat from the information handling system, the cooling component comprising:

at least one cooling device that effects dissipation of heat away from one or more heat producing components via one or more of an active cooling and a passive cooling;

a non-volatile storage having stored therein component data associated with the cooling component, wherein the component data includes at least an identification of the cooling device and heat removal effectiveness of the cooling component; and a communication cable having at least one signal bus on which the component data on the cooling component is retrieved via a connected controller, wherein the controller selects a performance characteristics of the information handling system based at least in part on the retrieved component data, wherein an overall heat removal capacity within the overall information handling system, inclusive of the heat removal effectiveness of the cooling component, results in a corresponding heat dissipation parameter of the information handling system that supports overclocking; and wherein the controller:

identifies a maximum achievable performance of the information handling system;

determines, from the component data, a corresponding adjustment in the overall heat removal capability within the overall information handling system by mapping the component data to an entry within a look-up data structure, the look-up data structure located within a nonvolatile storage and accessible by a basic input output system (BIOS) of the information handling system during a system start-up process, wherein the look-up data structure includes an entry for a first fan that removes heat from the system operating with an auxiliary fan that draws in cooler air into the system, wherein the first fan and auxiliary fan work together to increase an overall heat removal capability by an amount greater than a sum of each individual heat removal capability;

determines that the overall heat removal capability within the overall information handling system supports the overclocking; and in response to determining that the overall heat removal capability supports overclocking:
   selects the applicable performance characteristics of the information handling system based on the overall heat removal capability and the maximum achievable performance; and
   adjusts the operating parameters of the information handling system to enable the overclocking.

\* \* \* \* \*